(12) United States Patent
Huang et al.

(10) Patent No.: US 8,987,761 B2
(45) Date of Patent: Mar. 24, 2015

(54) LIGHT-EMITTING DEVICE

(75) Inventors: Yu-Min Huang, Tainan (TW);
Kuo-Chen Wu, Kaohsiung (TW);
Jun-Sheng Li, New Taipei (TW)

(73) Assignee: Huga Optotech Inc., Taichung (TW)

( * ) Notice: Subject to any disclaimer, the term of this patent is extended or adjusted under 35 U.S.C. 154(b) by 112 days.

(21) Appl. No.: 13/398,850

(22) Filed: Feb. 17, 2012

(65) Prior Publication Data
US 2013/0026519 A1   Jan. 31, 2013

(30) Foreign Application Priority Data
Jul. 25, 2011 (TW) .............................. 100126198 A

(51) Int. Cl.
| | |
|---|---|
| H01L 33/60 | (2010.01) |
| H01L 33/46 | (2010.01) |
| H01L 33/20 | (2010.01) |
| H01L 33/38 | (2010.01) |
| H01L 33/42 | (2010.01) |

(52) U.S. Cl.
CPC ................ H01L 33/46 (2013.01); H01L 33/20 (2013.01); H01L 33/38 (2013.01); *H01L 33/382* (2013.01); *H01L 33/42* (2013.01)
USPC .. 257/98; 257/88; 257/E33.067; 257/E33.069

(58) Field of Classification Search
CPC ..... H01L 33/38; H01L 33/387; H01L 33/405; H01L 33/42
USPC ................ 257/88, 98, 99, E33.067, E33.069
See application file for complete search history.

(56) References Cited

U.S. PATENT DOCUMENTS

| | | | |
|---|---|---|---|
| 2008/0064133 A1 | 3/2008 | Lee et al. | |
| 2009/0128004 A1* | 5/2009 | Chao et al. | 313/498 |
| 2009/0309107 A1* | 12/2009 | Kang | 257/88 |
| 2011/0049472 A1* | 3/2011 | Kim et al. | 257/13 |

FOREIGN PATENT DOCUMENTS

| | | |
|---|---|---|
| TW | 550733 B | 9/2003 |
| TW | 200849655 A | 12/2008 |

* cited by examiner

*Primary Examiner* — Minchul Yang
(74) *Attorney, Agent, or Firm* — Muncy, Geissler, Olds & Lowe, P.C.

(57) ABSTRACT

A structure of a light-emitting device includes the following components: a substrate; an epitaxial structure on the substrate, the epitaxial structure including at least a first conductivity type semiconductor layer, a light-emitting active layer, and a second conductivity type semiconductor layer; a first electrode on the first conductivity type semiconductor layer; a transparent conductive layer between the first electrode and the first conductivity type semiconductor layer; and a three-dimensional distributed Bragg reflector (DBR) layer between the transparent conductive layer and the first conductivity type semiconductor layer.

14 Claims, 16 Drawing Sheets

LIGHT-EMITTING DEVICE

BACKGROUND OF THE INVENTION

1. Field of the Invention

The present invention generally relates to the field of light-emitting devices. More particularly, the present invention relates to a light-emitting device with a 3-dimensional distributed Bragg reflector (DBR).

2. Description of the Prior Art

A light-emitting diode (LED) is a solid-state semiconductor light source that is fabricated with semiconductor materials. LEDs are used in applications as diverse as: replacements for aviation lighting, automotive lighting (particularly for indicators) and in traffic signals. The compact size of LEDs has allowed new text and video display or sensor devices to be developed, with their quick switching rates being very useful for advanced communication technology.

A structure of a conventional light-emitting device generally includes a substrate, an epitaxial structure disposed on the substrate, a P-side electrode pad electrically connected to a P-type semiconductor contact layer located in the epitaxial structure, a N-side electrode pad electrically connecting to a N-type semiconductor contact layer located in the epitaxial structure, an active layer disposed between the P-type semiconductor contact layer and the N-type semiconductor contact layer. In addition, a transparent conductive layer (TCL) is usually disposed between the P-side electrode pad and the P-type semiconductor contact layer in order to create an ohmic contact.

According to a prior art disclosed in U.S. Pub. No. 2008/0064133 A1, a flip-chip type nitride light-emitting device has a mesh-type DBR disposed between a P-side electrode and a P-type nitride semiconductor layer. The mesh-type DBR has a plurality of mesh-like openings, exposing parts of the P-type nitride semiconductor layer and extended on the top surface of the P-type nitride semiconductor layer in a two-dimensional direction. An ohmic contact layer is provided to cover the mesh-type DBR and fill up the mesh-like openings so that the surface of the P-type nitride semiconductor layer not covered by the mesh-type DBR may be in contact directly with the ohmic contact layer. The P-side electrode is disposed on the ohmic contact layer. The composition of the above-mentioned ohmic contact layer comprises nickel, silver, aluminum or other similar metals, and the configuration of the mesh-type DBR is an AlGaN/GaN stack structure. Both of the ohmic contact layer and mesh-type DBR have a high reflectivity, so that light emitted from the active layer may be reflected by these highly reflective components and emit from a top surface of a transparent substrate.

T.W. Pub. No. 200921931 discloses another flip-chip type light-emitting device. The characteristic of the light-emitting device is that a P-side electrode and an N-side electrode are disposed on the same level, so that the distance between the P-side electrode and the N-side electrode can be shortened. The light-emitting device has a reflector layer formed under the P-side electrode via thermal evaporation, electron-beam deposition, or sputter deposition. Since the P-side electrode has to be electrically connected to a contact layer, the reflector must be composed of conductive materials.

SUMMARY OF THE INVENTION

The main objective of the invention is to provide an improved light-emitting device which has a better light extraction efficiency compared to conventional light-emitting devices.

According to one embodiment, the present invention comprises a light-emitting device, a substrate, an epitaxial structure on the substrate, with the epitaxial structure including at least a first conductivity type semiconductor layer, a light-emitting active layer, and a second conductivity type semiconductor layer; a first electrode on the first conductivity type semiconductor layer; a transparent conductive layer between the first electrode and the first conductivity type semiconductor layer; and a three-dimensional distributed Bragg reflector (DBR) layer between the transparent conductive layer and the first conductivity type semiconductor layer.

According to another embodiment of the present invention, a light-emitting device comprises a substrate; an epitaxial structure on the substrate with its epitaxial structure including at least a first conductivity type semiconductor layer, a light-emitting active layer, and a second conductivity type semiconductor layer; a first electrode on the first conductivity type semiconductor layer; a transparent conductive layer between the first electrode and the first conductivity type semiconductor layer; and a three-dimensional distributed Bragg reflector (DBR) layer between the transparent conductive layer and the first conductivity type semiconductor layer, wherein the first electrode includes a P-side electrode pad and the three-dimensional distributed Bragg reflector is located under the P-side electrode pad only.

In another embodiment of the present invention, a light-emitting device comprises a substrate; an epitaxial structure on the substrate with the epitaxial structure including at least a first conductivity type semiconductor layer, a light-emitting active layer, and a second conductivity type semiconductor layer; a first electrode on the first conductivity type semiconductor layer; a transparent conductive layer between the first electrode and the first conductivity type semiconductor layer; and a three-dimensional distributed Bragg reflector (DBR) layer between the transparent conductive layer and the first conductivity type semiconductor layer, wherein the first electrode further includes at least a branch electrode, the transparent conductive layer overlapping the branch electrode only, and the first electrode being in direct contact with the three-dimensional distributed Bragg reflector.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings provide a further understanding of the invention, are incorporated in and constitute a part of this specification. The drawings illustrate embodiments of the invention and, together with the description, serve to explain the principles of the invention. In the drawings.

Figure 1A:
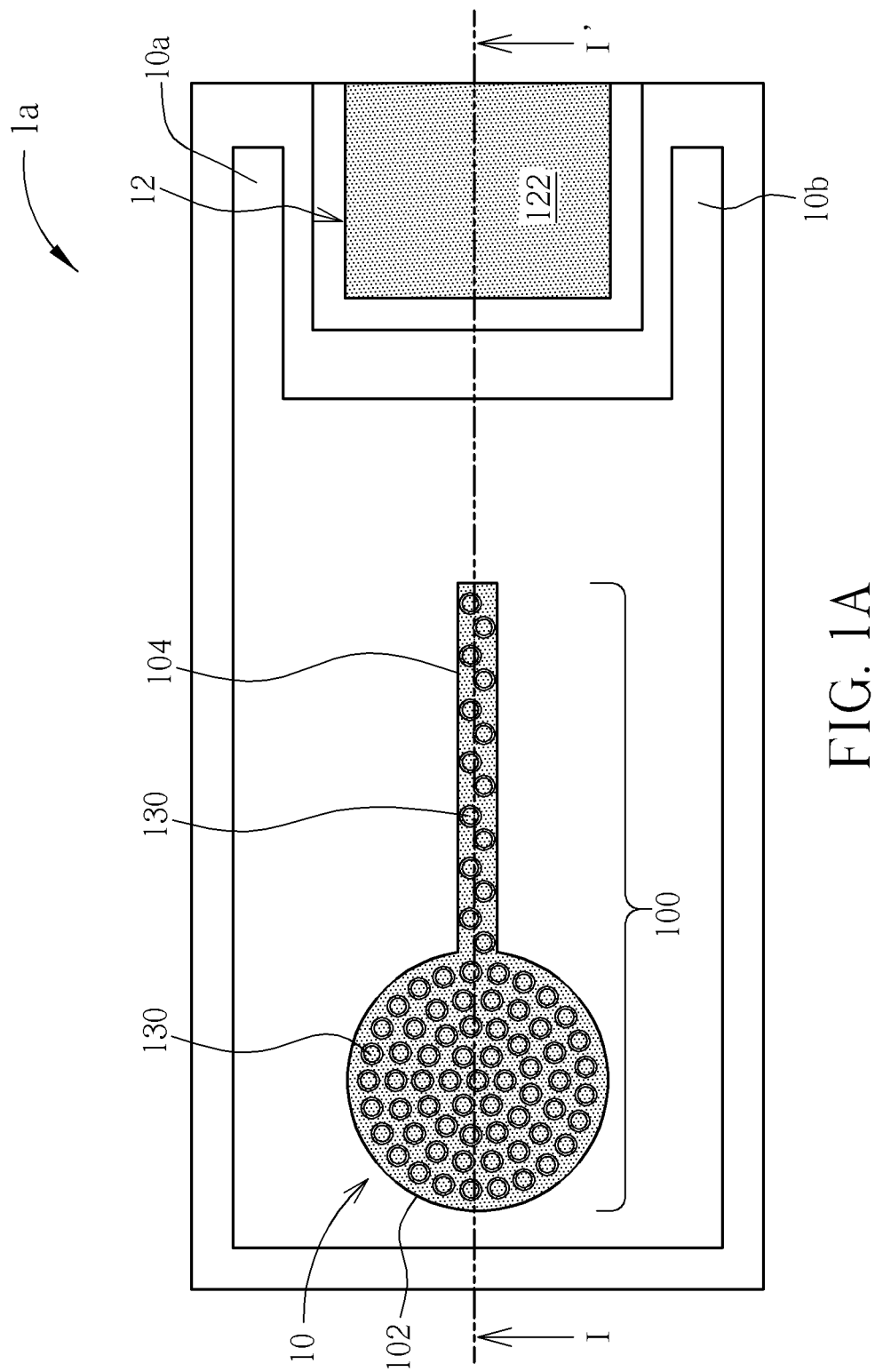
FIG. 1A is a schematic top view showing a light-emitting device according to one embodiment of the invention.

It should be noted that all the figures are for representation only. Relative dimensions and proportions of parts of the drawings are exaggerated or reduced in size, for the sake of clarity and convenience. The same reference signs are generally used to refer to corresponding or similar features in modified and different embodiments.

DETAILED DESCRIPTION

In the following description, numerous specific details are given to provide a thorough understanding of the invention. It will, however, be apparent to one skilled in the art that the invention may be practiced without these specific details. Furthermore, some well-known system configurations and process steps are not disclosed in detail, as these should be well-known to those skilled in the art.

Likewise, the drawings showing embodiments of the apparatus are not to scale and some dimensions are exaggerated for clarity of presentation. Also, where multiple embodiments are disclosed and described as having some features in common, like or similar features will usually be described with like reference numerals for ease of illustration and description thereof.

Figure 1B:
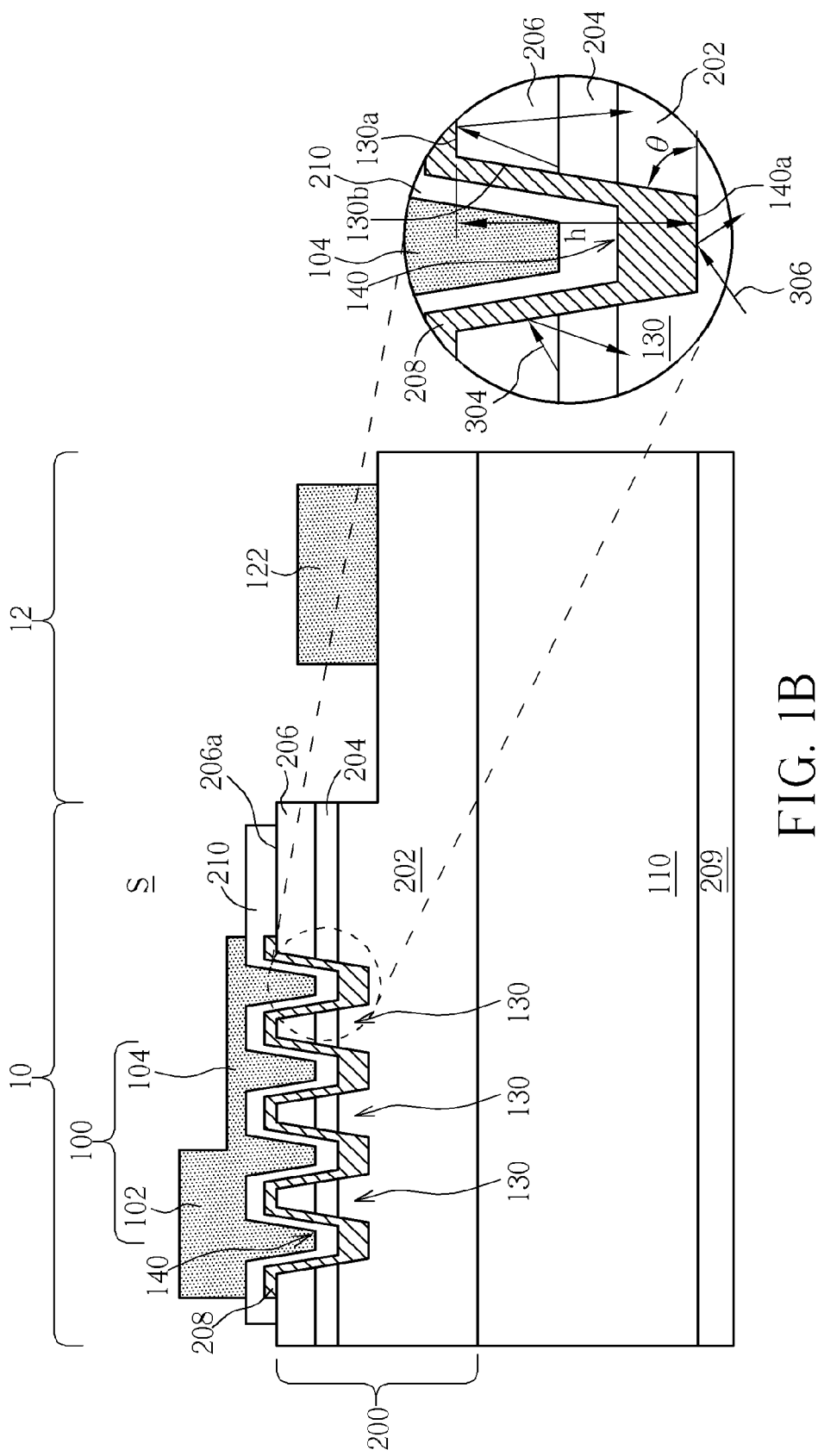
FIG. 1B is a schematic, cross-sectional view taken along a line I-I' in FIG. 1A.

Please refer FIG. 1A to FIG. 1B. FIG. 1A is a schematic top view showing a light-emitting device according to one embodiment of the invention. FIG. 1B is a schematic, cross-sectional view taken along a line I-I' in FIG. 1A. First, as shown in FIG. 1A and FIG. 1B, the invention provides a light-emitting device 1a including a mesa area 10 and an N electrode contact area 12, wherein the mesa area 10 is an island structure, whose top surface 206a is higher than that of the N electrode contact area 12, and has two extension parts 10a, 10b embracing the N electrode contact area 12. According to an embodiment of the invention, a P-side electrode 100 is disposed on the front face S of the mesa area 10, wherein the P-side electrode 100 includes a P-side electrode pad 102 and a branch electrode 104. The branch electrode 104 is electrically connected to the P-side electrode pad 102 and extends from it. An N-electrode pad 122 is formed inside the N electrode contact area 12. It should be noted that the above-mentioned structure is only for explanation and should not be viewed as a restriction. For instance, the branch electrode 104 may be omitted or the branch electrode 104 may be replaced by another P-side electrode pad 102. According to this embodiment, the light-emitting device 1a is a front-type light-emitting device, that is to say, most of the light is emitted from the front face S of the mesa area 10.

According to one embodiment of the invention, the composition of the P-side electrode pad 102 and the branch electrode 104 may include Cr, Au, Ni, Ti, TiN, Ta, Al, Ag, In, W, InSn, WSi, Nd, Pd, Pt, Zr, composites thereof, or alloys thereof, but not limited to. For instance, the composition of the P-electrode pad 102 and the branch electrode 104 may be Cr/Au. According to another embodiment of the invention, the composition of the N-side electrode pad 122 may also include Cr, Au, Ni, Ti, TiN, Ta, Al, Ag, In, W, InSn, WSi, Nd, Pd, Pt, Zr, composites thereof, or alloys thereof, but not limited to.

As illustrated in FIG. 1B, the mesa area 10 includes an epitaxial structure 200 formed on the surface of the substrate 110, wherein the epitaxial structure 200 includes at least an N-type semiconductor layer 202, a light-emitting active layer 204, and a P-type semiconductor layer 206. According to this embodiment, the substrate 110 may be a sapphire substrate, a GaAs substrate, a silicon carbide substrate, or a silicon substrate but is not limited thereto. And the N-type semiconductor layer 202 and the P-type semiconductor layer 206 may be N-type GaN layer and P-type GaN layer, respectively, but is not limited thereto. The light-emitting active layer 204 may include an undoped GaN layer or a InGaN layer and a multiple quantum well (MQW) structure may be disposed in the light-emitting active layer 204, but is not limited thereto. Moreover, a reflector 209 may be disposed on the bottom of the substrate 110, opposed to the side of the front face S, in order to reflect the light originated from the light-emitting active layer 204, and improve the light extraction efficiency of the light-emitting device 1a.

The above-mentioned epitaxial structure 200 may be fabricated by metal organic chemical vapor deposition (MOCVD), molecular beam epitaxy (MBE), or hydride vapor phase epitaxy (HVPE). In addition, depending on the requirements, a cladding layer, a buffer layer, or a reflector layer may be disposed between the N-type semiconductor layer 202 and the substrate 110. Since the epitaxial structure 200 is fabricated via conventional method, its process detailed description is omitted for brevity purposes.

Figure 2:
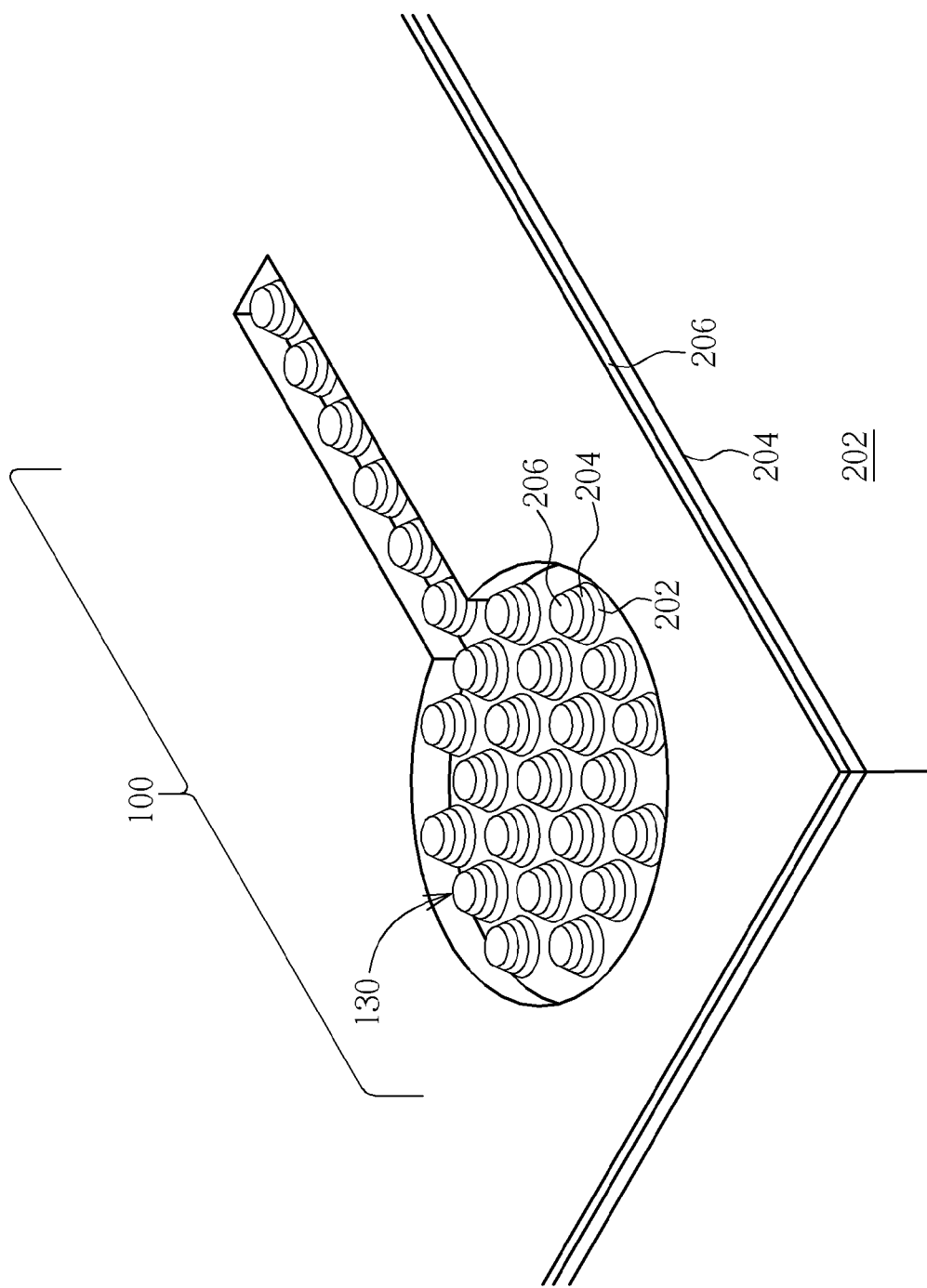
FIG. 2 is a three dimensional side view showing the structure of pillar structures in a light-emitting device.

The specificity of the light-emitting device 1a is to provide a plurality of pillar structures 130 disposed under the P-side electrode 100 only, instead of on an area outside of the P-side electrode 100. According to this embodiment, each pillar structure 130 includes at least the N-type semiconductor layer 202, the light-emitting active layer 204, and the P-type semiconductor layer 206 of the epitaxial structure 200. Several recessed trenches 140 are formed between the plurality of pillar structures 130, wherein the recessed trenches 140 are formed by etching the P-type semiconductor layer 206, the light-emitting active layer 204, and the N-type semiconductor layer 202 from the front face S of the mesa area 10 with a specific depth. In this embodiment, the depth of the recessed trench 140 is deeper than that of the light-emitting active area 204 and goes down inside of the N-type semiconductor layer 202. As shown in FIG. 2, the outline of the pillar structure 130 is similar to a truncated cone. In another embodiment, however, the outline of the pillar structure 130 may be a frustum of a pyramid, but is not limited thereto. The pillar structures 130 are formed by etching the P-type semiconductor layer 206, the light-emitting active layer 204, and the N-type semiconductor layer 202. Therefore, the top surface 130a of the pillar structures 130 is leveled with the top surface of the P-type semiconductor layer 206; that is to say, the top surface 130a shall not protrude from the front face S of the mesa area 10.

The encircled region on the right side of the FIG. 1B shows an enlarged diagram of the partial pillar structures 130 and the recessed trench 140. In the enlarged diagram, each pillar structure 130 has a top surface 130a and an oblique sidewall 130b, and the recessed trench 140 has a bottom surface 140a. According to one embodiment of the invention, the P-type semiconductor layer 206 has a top surface 206a and a vertical height h between the top surface 206a, and the bottom surface 140a of the recessed trench 140 is at least 0.2 μm wide, more specifically, 0.2 μm to 8 μm wide. In addition, the light-emitting device 1a further includes a distributed Bragg reflector (DBR) 208. According to this embodiment, the distributed Bragg reflector 208 is a three-dimensional structure which covers totally and uniformly the top surface 130a, the oblique sidewalls 130b of the pillar structures 130, and also the bottom surface 140a of the recessed trench 140. A transparent conductive layer (TCL) 210, like indium tin oxide (ITO) for example, is disposed upon the distributed Bragg reflector 208 and covers the front face S of the mesa area 10. According to this embodiment, an angle between the oblique sidewalls 130b and the bottom surface 140a is an acute angle θ ranging between 35° and 80°. The acute angle θ may improve the void filling capability of the transparent conductive layer 210. Therefore, the relatively high voltage drop arising from the poor coverage of the transparent conductive layer 210 at the corner of the recessed trench 140 can be eliminated. The distributed Bragg reflector 208 may serve as a reflector to reflect the light generated by the light-emitting active layer 204. For example, a light ray 304 emitted from the light-emitting active layer 204 may be reflected by the distributed Bragg reflector 208 located on the oblique sidewall 130b of the pillar structure 130, thereby preventing its absorption by the P-side electrode 100. In another example, a light ray 306 may be reflected by the distributed Bragg reflector 208 located on the bottom surface 140a of the recessed trench 140, thereby preventing its absorption by the P-side electrode 100. In this embodiment, the distributed Bragg reflector 208 located between the transparent conductive layer 210 and the P-type semiconductor layer 206 consists of a reflective and insulated material which structure is uniform and continuous. For instance, the distributed Bragg reflector 208 is in a stack structure comprising titanium dioxide and silicon dioxide, which may not only act as a reflector, but also serve as a barrier layer to prevent current penetration. Therefore, in the light-emitting device 1a, both the P-side electrode pad 102 and the branch electrode 104 are electrically connected to the P-type semiconductor layer 206 through the transparent conductive layer 210. With the distributed Bragg reflector 208 disposed under the P-side electrode 100, current from an external circuit may be uniformly distributed on the front face S of the mesa area 10 in the lateral direction, and may not penetrate the distributed Bragg reflector 208.

Figure 3:
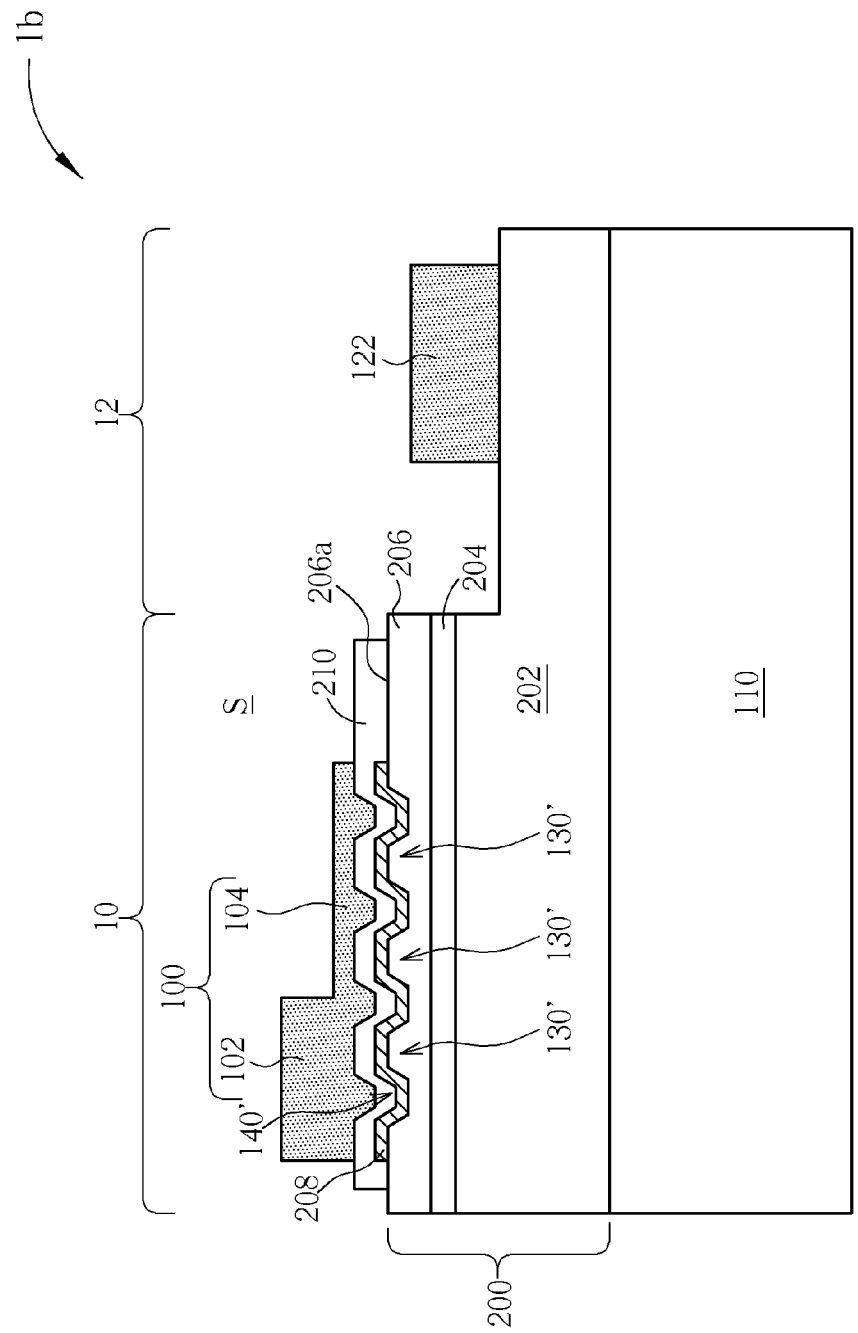
FIG. 3 is a schematic, cross-sectional view showing a light-emitting device according to another embodiment of the invention.

Please refer to FIG. 3. FIG. 3 is a schematic, cross-sectional view showing a light-emitting device according to another embodiment of the present invention using similar numeral references for ease of illustration and description. A light-emitting device 1b shown in FIG. 3 includes a mesa area 10 and an N electrode contact area 12, wherein the mesa area 10 is an island structure, which top surface 206a is higher than that of the N electrode contact area 12. A P-side electrode 100 is disposed on the front face S of the mesa area 10, wherein the P-side electrode 100 includes a P-side electrode pad 102 and a branch electrode 104. The branch electrode 104 extends from the P-side electrode pad 102 and is electrically connected to it. An N-electrode pad 122 is disposed inside the N electrode contact area 12. The epitaxial structure 200 includes at least an N-type semiconductor layer 202, a light-emitting active layer 204, and a P-type semiconductor layer 206. A reflector (not shown) may be disposed on the bottom of the substrate 110, opposed to the side of the front face S, to reflect the light generated by the light-emitting active layer 204 and improve the light extraction efficiency of the light-emitting device 1b. A plurality of pillar structures 130' is disposed under the P-side electrode 100 only, instead of on an area outside the P-side electrode 100. According to this embodiment, each pillar structure 130' includes only the P-type semiconductor layer 206, which means that the depth of the recessed trenches 140' between the pillar structures 130' must not exceed the thickness of the P-type semiconductor layer 206. In addition, the light-emitting device 1b further includes a distributed Bragg reflector (DBR) 208 which covers totally and uniformly the surface of the pillar structures 130' and the recessed trenches 140'. A transparent conductive layer (TCL) 210, like indium tin oxide (ITO) for example, is disposed on the distributed Bragg reflector 208 and covers the front face S of the mesa area 10. The P-electrode pad 102 and the branch electrode 104 are disposed on the transparent conductive layer 210.

Figure 4:
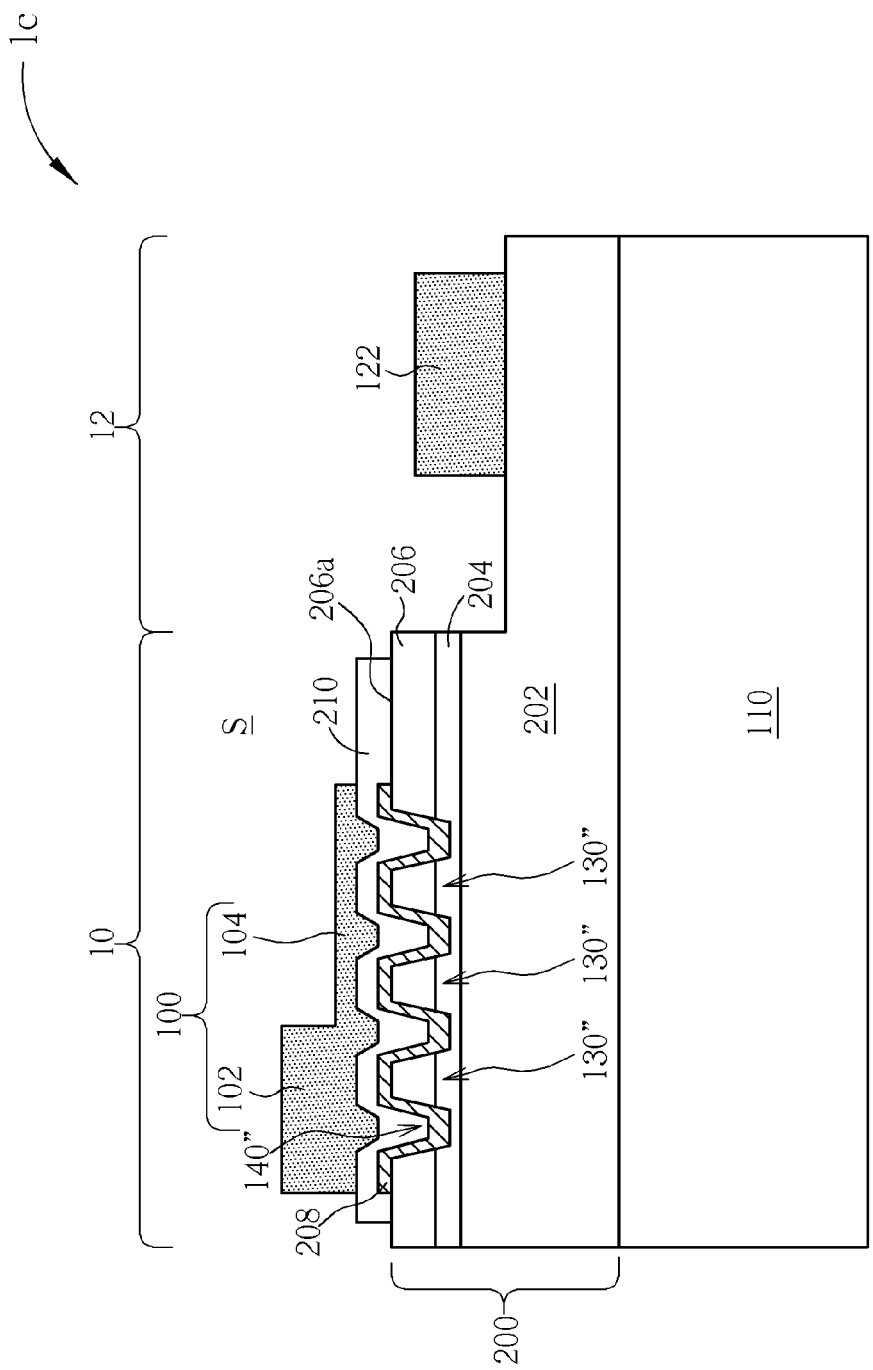
FIG. 4 is a schematic, cross-sectional view showing a light-emitting device according to still another embodiment of the invention.

Please refer to FIG. 4. FIG. 4 is a schematic, cross-sectional view showing a light-emitting device according to still another embodiment of the invention, using similar references for ease of illustration and description. A light-emitting device 1c shown in FIG. 4 includes a mesa area 10 and an N electrode contact area 12, wherein the mesa area 10 is an island structure which top surface 206a is higher than that of the N electrode contact area 12. A P-side electrode 100 is disposed on the front face S of the mesa area 10, wherein the P-side electrode 100 includes a P-side electrode pad 102 and a branch electrode 104. The branch electrode 104 extends from the P-side electrode pad 102 and is electrically connected to it. An N-electrode pad 122 is disposed inside the N electrode contact area 12. The epitaxial structure 200 at least includes an N-type semiconductor layer 202, a light-emitting active layer 204, and a P-type semiconductor layer 206. A reflector (not shown) may be disposed on the bottom of the substrate 110, opposed to the side of the front face S, to reflect the light generated by the light-emitting active layer 204 and improve the light extraction efficiency of the light-emitting device 1b. A plurality of pillar structures 130' is disposed only under the P-side electrode 100 instead of an area outside the P-side electrode 100. According to this embodiment, each pillar structure 130" includes the P-type semiconductor layer 206 and the light-emitting active layer 204 only, that is to say, the depth of the recessed trenches 140" between the pillar structures 130" must not exceed the combined thickness of the P-type semiconductor layer 206 and the light-emitting active layer 204. In addition, the light-emitting device 1c further includes a distributed Bragg reflector (DBR) 208 which covers totally and uniformly the surface of the pillar structures 130" and the recessed trench 140". A transparent conductive layer (TCL) 210, like indium tin oxide (ITO) for example, is disposed on the distributed Bragg reflector 208 and covers the front face S of the mesa area 10. The P-electrode pad 102 and the branch electrode 104 are disposed on the transparent conductive layer 210.

Figure 5A:
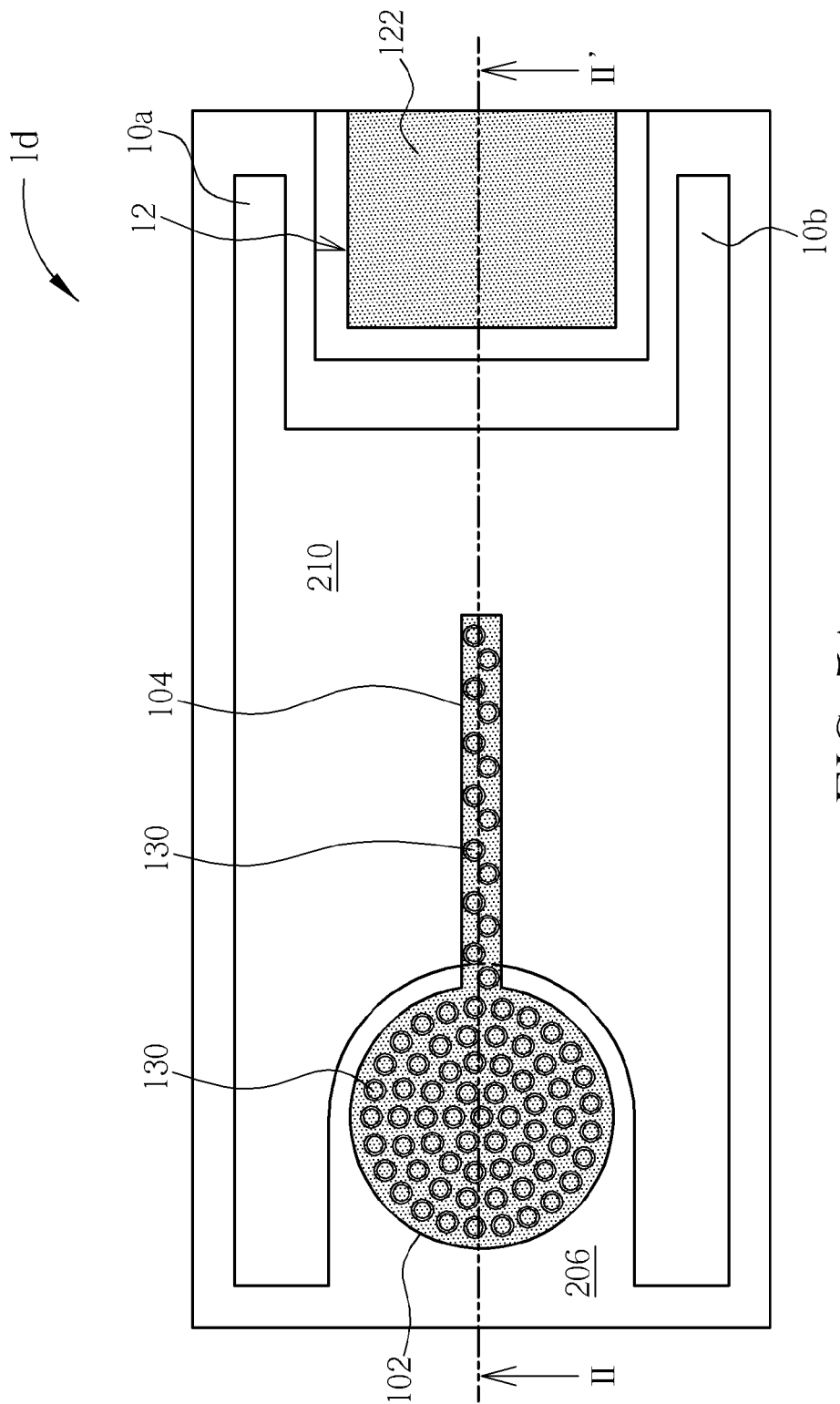
FIG. 5A is a schematic top view showing a light-emitting device according to still another embodiment of the invention.
Figure 5B:
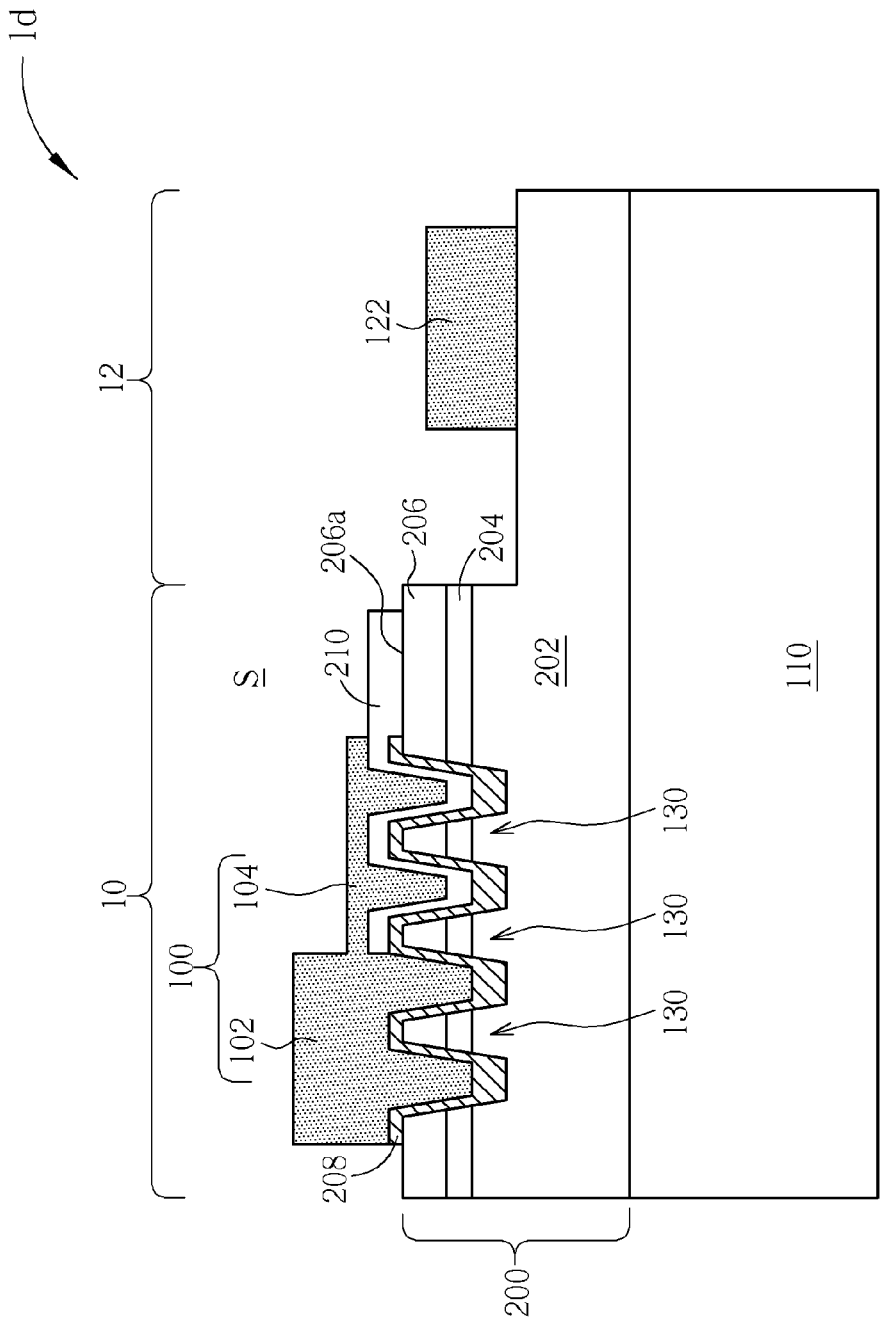
FIG. 5B is a schematic, cross-sectional view taken along a line II-II' in FIG. 5A.

Please refer to FIG. 5A and FIG. 5B. FIG. 5A is a schematic top view showing a light-emitting device according to still another embodiment of the present invention. FIG. 5B is a schematic, cross-sectional view taken along a line II-II' in FIG. 5A. A light-emitting device 1d shown in FIG. 5A and FIG. 5B is similar to the light-emitting device 1a; the only difference between them is that there is no transparent conductive layer 210 under a P-side electrode pad 102 in the former. The transparent conductive layer 210 overlaps with a branch electrode 104 only. Therefore, the P-side electrode pad 102 has a direct contact with a distributed Bragg reflector 208. It is known that the distributed Bragg reflector 208 is electrically insulated; hence, current from an external circuit is forced to flow out of the branch electrode 104, which means that current can be more uniformly distributed in this structure. In addition, a reflector (not shown) may be disposed on the bottom of the substrate 110 opposed to the side of the front face S to reflect the light generated by the light-emitting active layer 204 and improve the light extraction efficiency of the light-emitting device 1d.

Figure 6A:
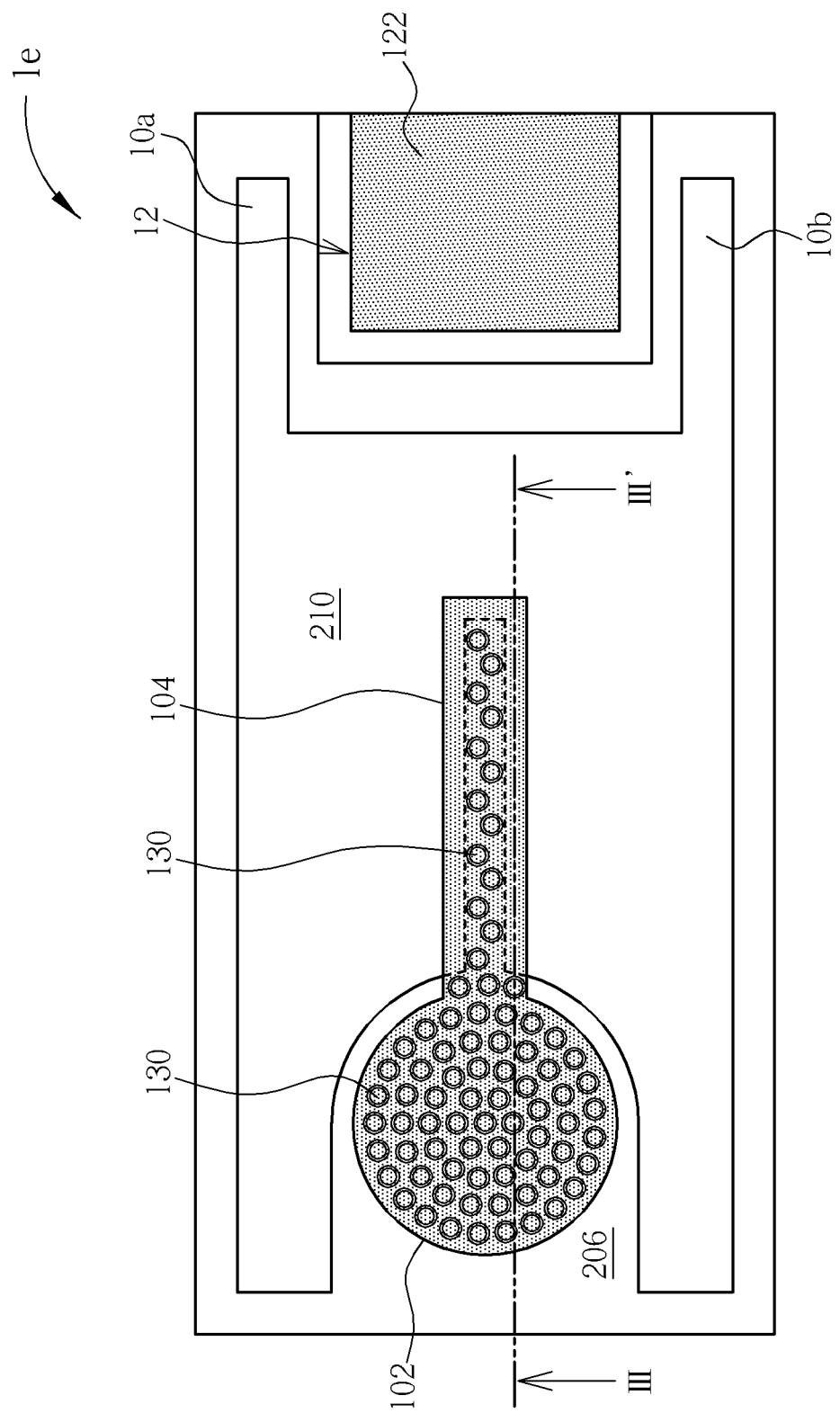
FIG. 6A is a schematic top view showing a light-emitting device according to still another embodiment of the invention.
Figure 6B:
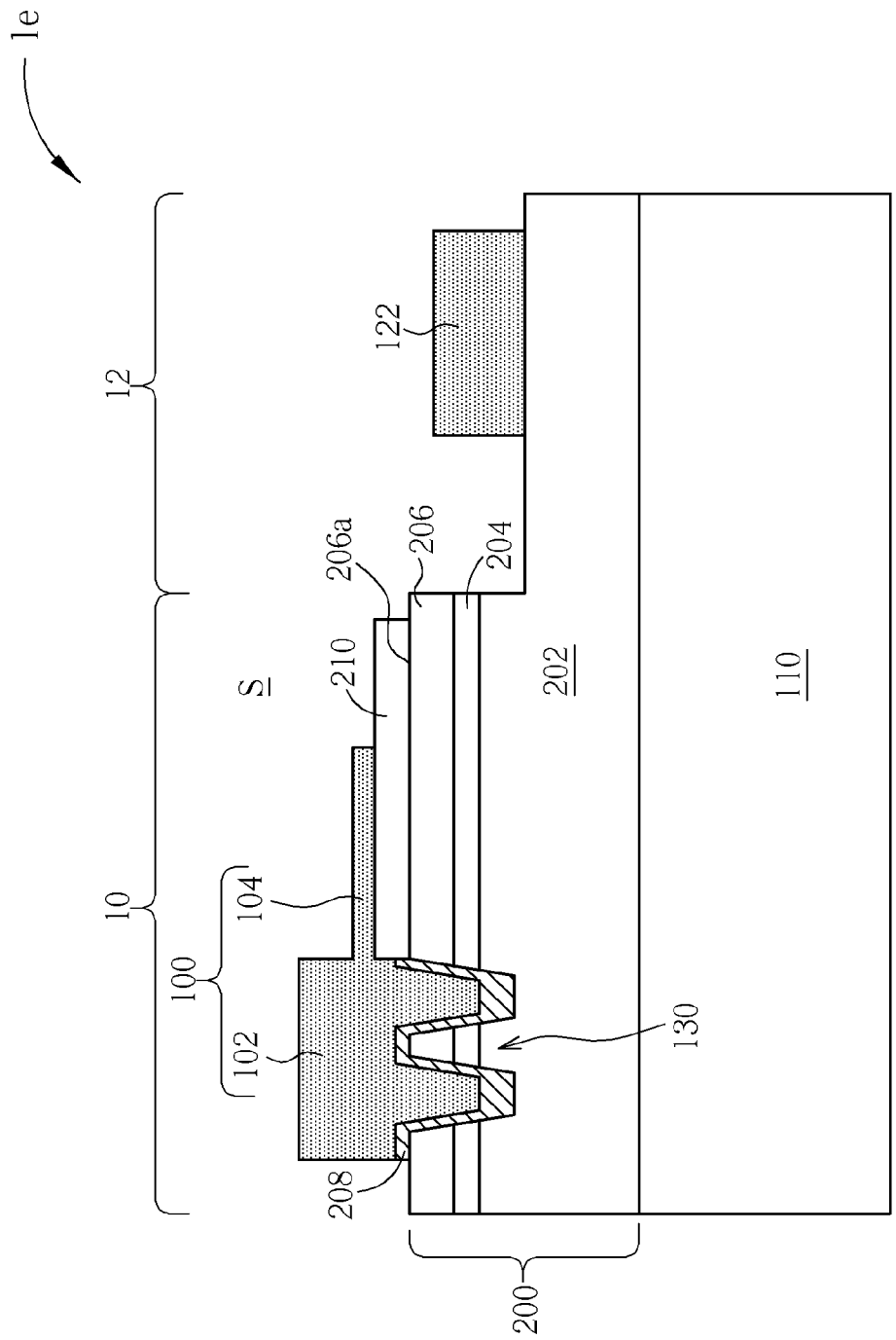
FIG. 6B is a schematic, cross-sectional view taken along a line III-III' in FIG. 6A.

Please refer to FIG. 6A and FIG. 6B, FIG. 6A is a schematic top view showing a light-emitting device according to still another embodiment of the invention. FIG. 6B is a schematic, cross-sectional view taken along a line III-III' in FIG. 6A. A light-emitting device 1e shown in FIG. 6A and FIG. 6B is similar to the light-emitting device 1a, but: (1) there is no transparent conductive layer 210 under a P-side electrode pad 102 in the former. A transparent conductive layer 210 overlaps with a branch electrode 104 only; (2) only the peripheral edge of the branch electrode 104 overlaps with the transparent conductive layer 210; (3) pillar structures 130 and distributed Bragg reflector 208 are formed under the P-side electrode pad only. Therefore, the P-side electrode pad 102 has a direct contact with a distributed Bragg reflector 208. It is know that the distributed Bragg reflector 208 is electrically insulated; hence, current from an external circuit will be forced to flow out of the branch electrode 104, which means that the current can be more uniformly distributed in this structure. In addition, a reflector (not shown) may be disposed on the bottom of the substrate 110 opposed to the side of the front face S to reflect the light generated by the light-emitting active layer 204 and improve the light extraction efficiency of the light-emitting device 1e.

Figure 7A:
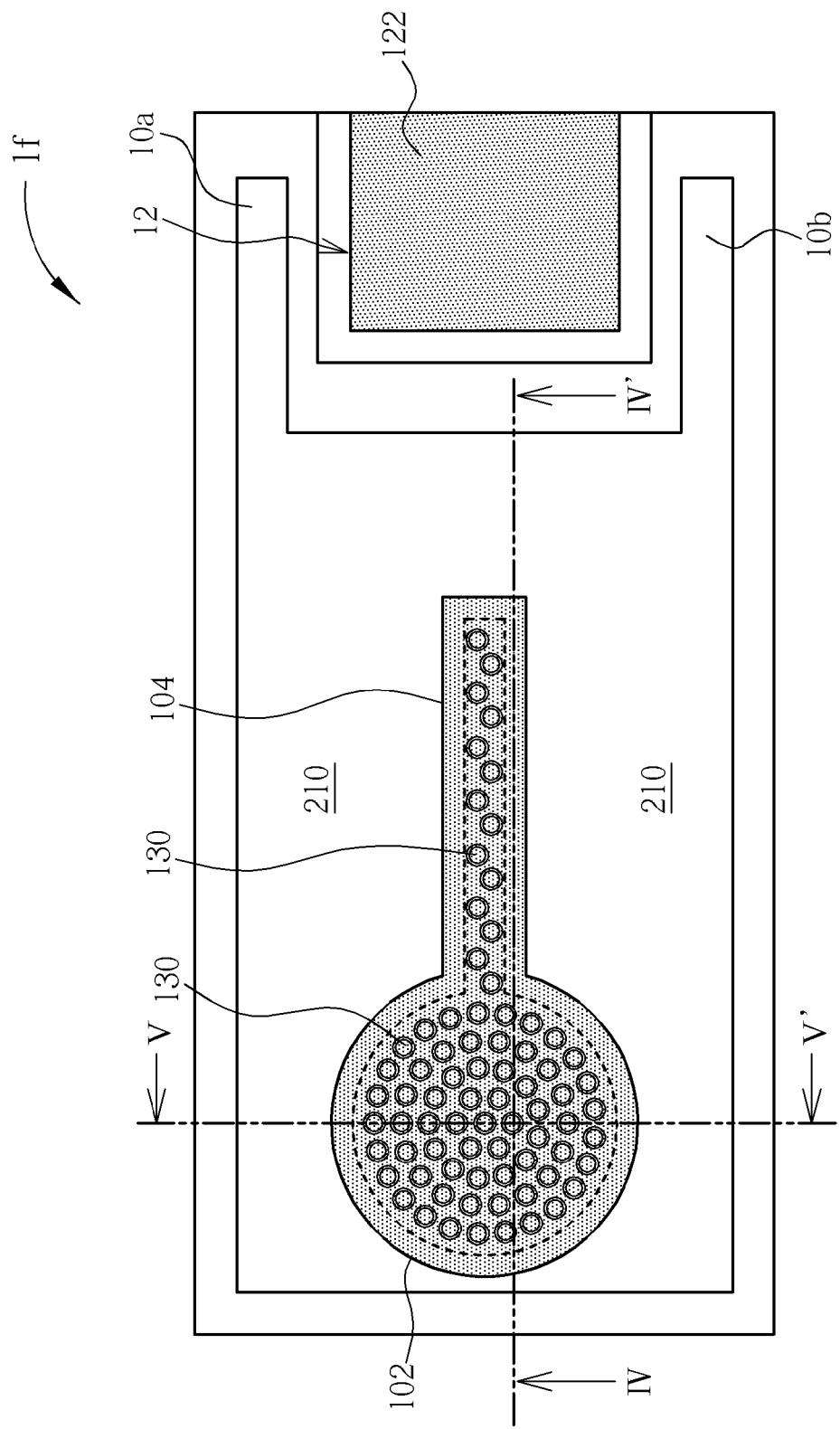
FIG. 7A is a schematic top view showing a light-emitting device according to still another embodiment of the invention.
Figure 7B:
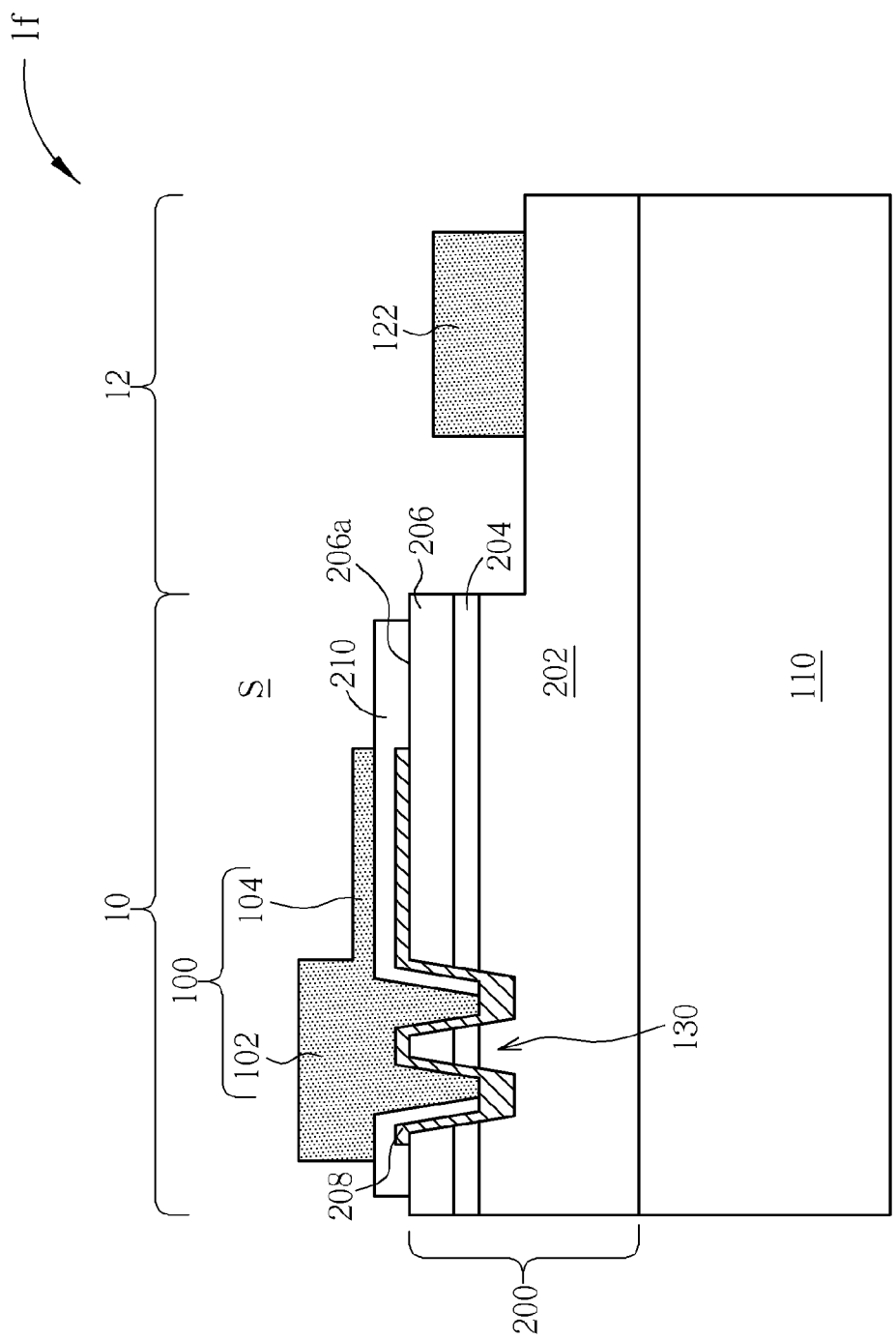
FIG. 7B is a schematic, cross-sectional view taken along a line IV-IV' in FIG. 7A.
Figure 7C:
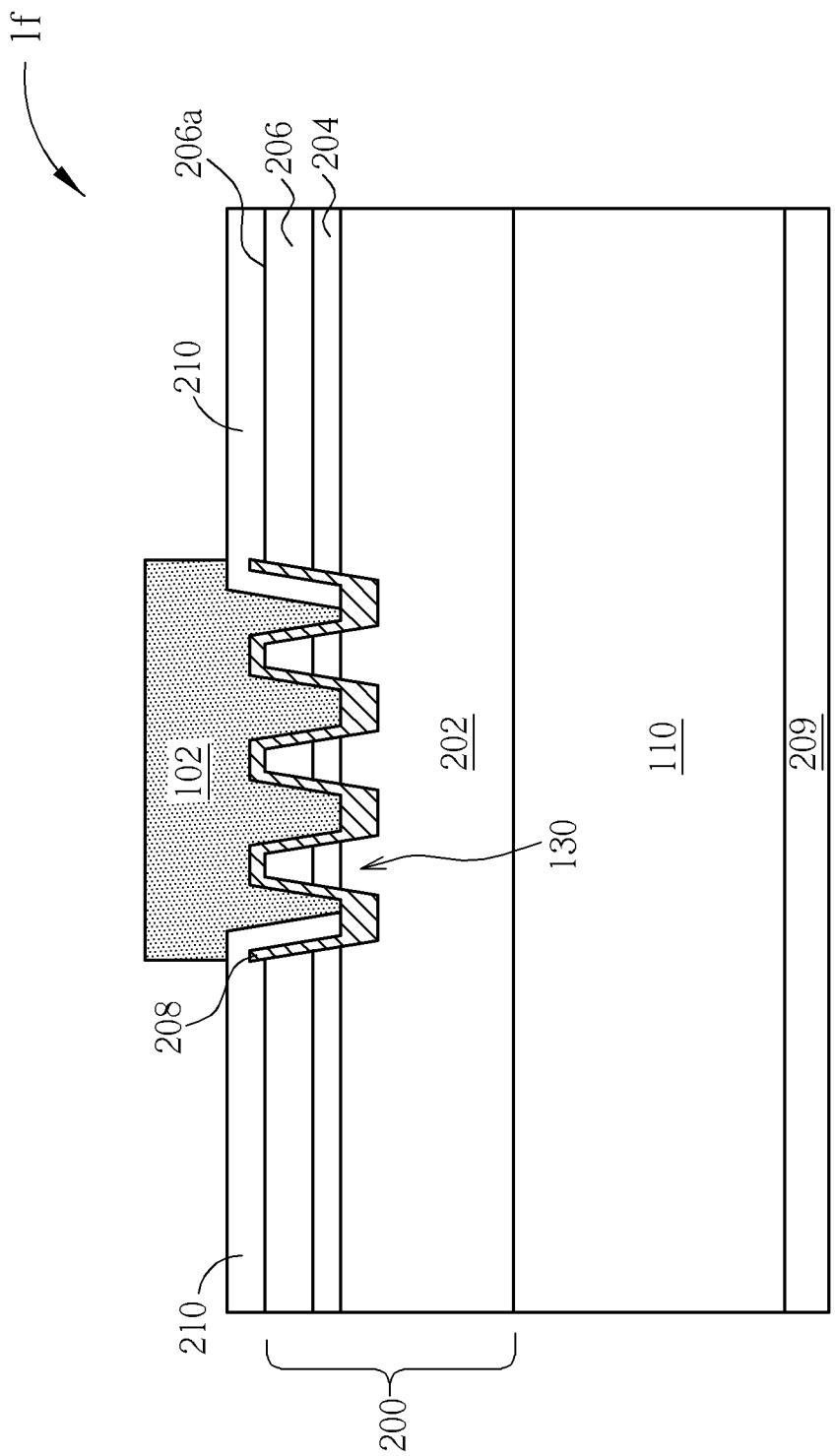
FIG. 7C is a schematic, cross-sectional view taken along a line V-V' in FIG. 7A.

Please refer to FIG. 7A to FIG. 7C, FIG. 7A is a schematic top view showing a light-emitting device according to still another embodiment of the invention. FIG. 7B is a schematic, cross-sectional view taken along a line IV-IV' in FIG. 7A. FIG. 7C is a schematic, cross-sectional view taken along a line V-V' in FIG. 7A. A light-emitting device 1f shown in FIG. 7A to FIG. 7B, is similar to the light-emitting device 1e, but the differences between them are described as follows: (1) a transparent conductive layer 210 not only overlaps with the peripheral edge of a branch electrode 104 but also overlaps with the peripheral edge of a P-side electrode pad 102; (2) a plurality of pillar structures 130 is formed under the P-side electrode pad only, a distributed Bragg reflector 208, however, forms a three-dimensional reflective pattern and a planar reflective pattern under the P-side electrode pad 102 and the branch electrode 104, respectively. Therefore, a current from an external circuit will be forced to flow out of the overlapped region within the branch electrode 104 and the P-side electrode pad 102. This means that current can be more uniformly distributed in this structure. In addition, as illustrated in FIG. 7C, a reflector 209 may be disposed on the bottom of the substrate 110 opposed to the side of the front face S to reflect the light generated by the light-emitting active layer 204 and improve the light extraction efficiency of the light-emitting device 1f.

Figure 8A:
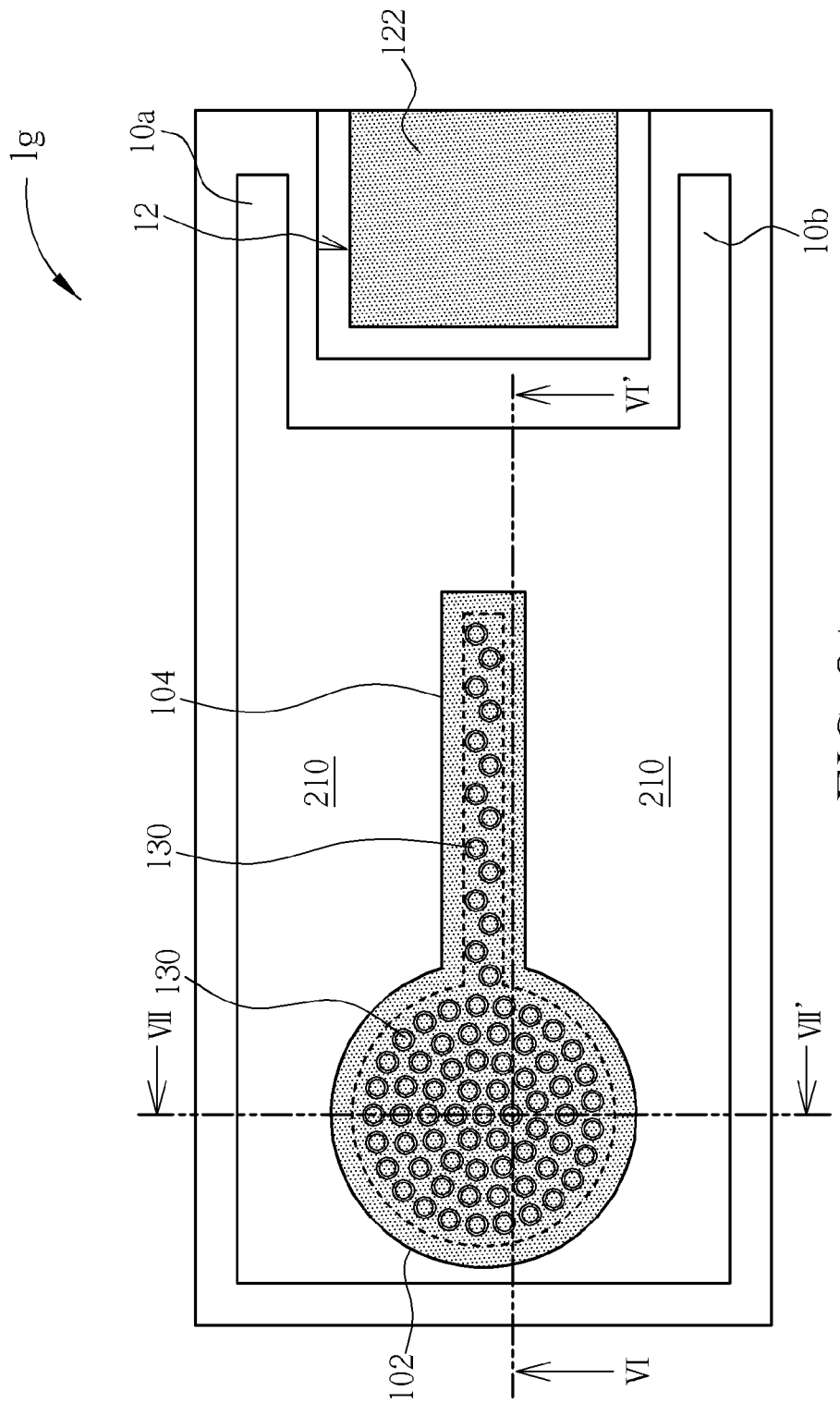
FIG. 8A is a schematic top view showing a light-emitting device according to still another embodiment of the invention.
Figure 8B:
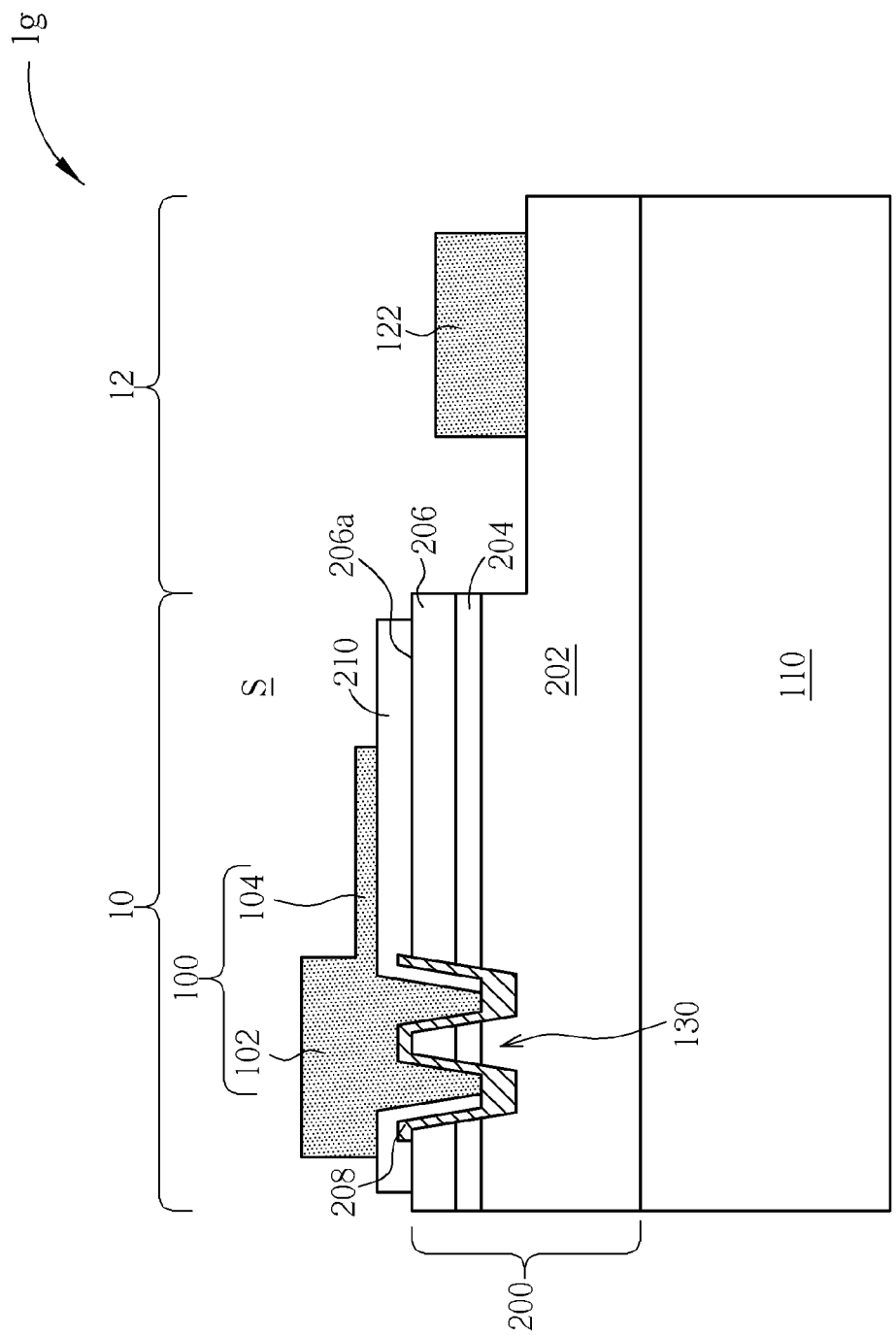
FIG. 8B is a schematic, cross-sectional view taken along a line VI-VI' in FIG. 8A.
Figure 8C:
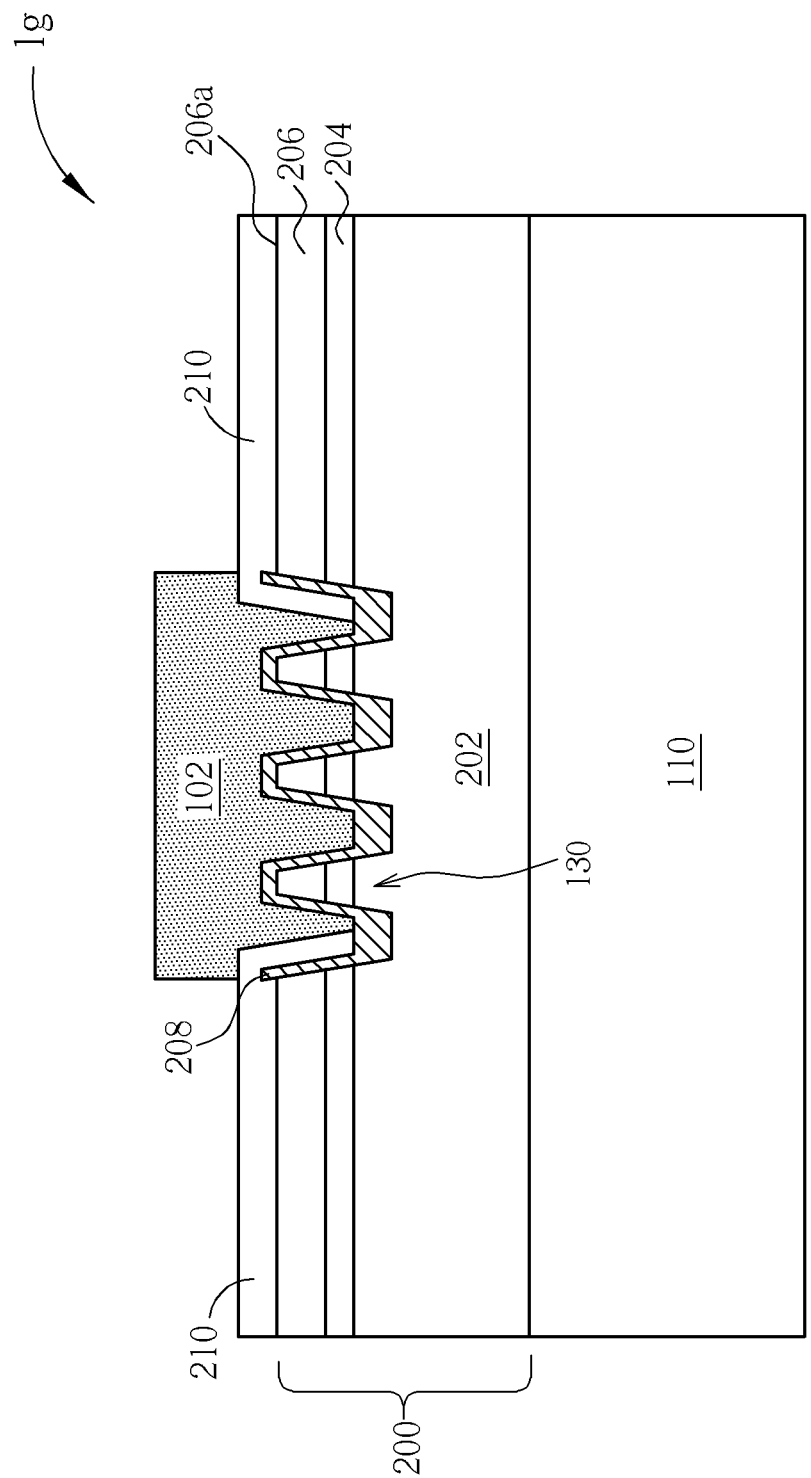
FIG. 8C is a schematic, cross-sectional view taken along a line VII-VII' in FIG. 8A.

Please refer to FIG. 8A to FIG. 8C, FIG. 8A is a schematic top view showing a light-emitting device according to still another embodiment of the present invention. FIG. 8B is a schematic, cross-sectional view taken along a line VI-VI' in FIG. 8A. FIG. 8C is a schematic, cross-sectional view taken along a line VII-VII' in FIG. 8A. A light-emitting device 1g shown in FIG. 8A to FIG. 8B is similar to the light-emitting device 1f; the only difference between them is that a distributed Bragg reflector 208 comprising a three-dimensional reflective pattern is formed only under a P-side electrode pad 102, and no distributed Bragg reflector exists under a branch electrode 104. Therefore, the current from an external circuit will be forced to flow out of the overlapped regions with a transparent conductive layer 210 within the branch electrode 104 and the P-side electrode pad 102, which means, that current can be more uniformly distributed in this structure. In addition, a reflector (not shown) may be disposed on the bottom of the substrate 110 opposed to the side of the front face S to reflect the light generated by the light-emitting active layer 204 and improve the light extraction efficiency of the light-emitting device 1f.

Figure 9:
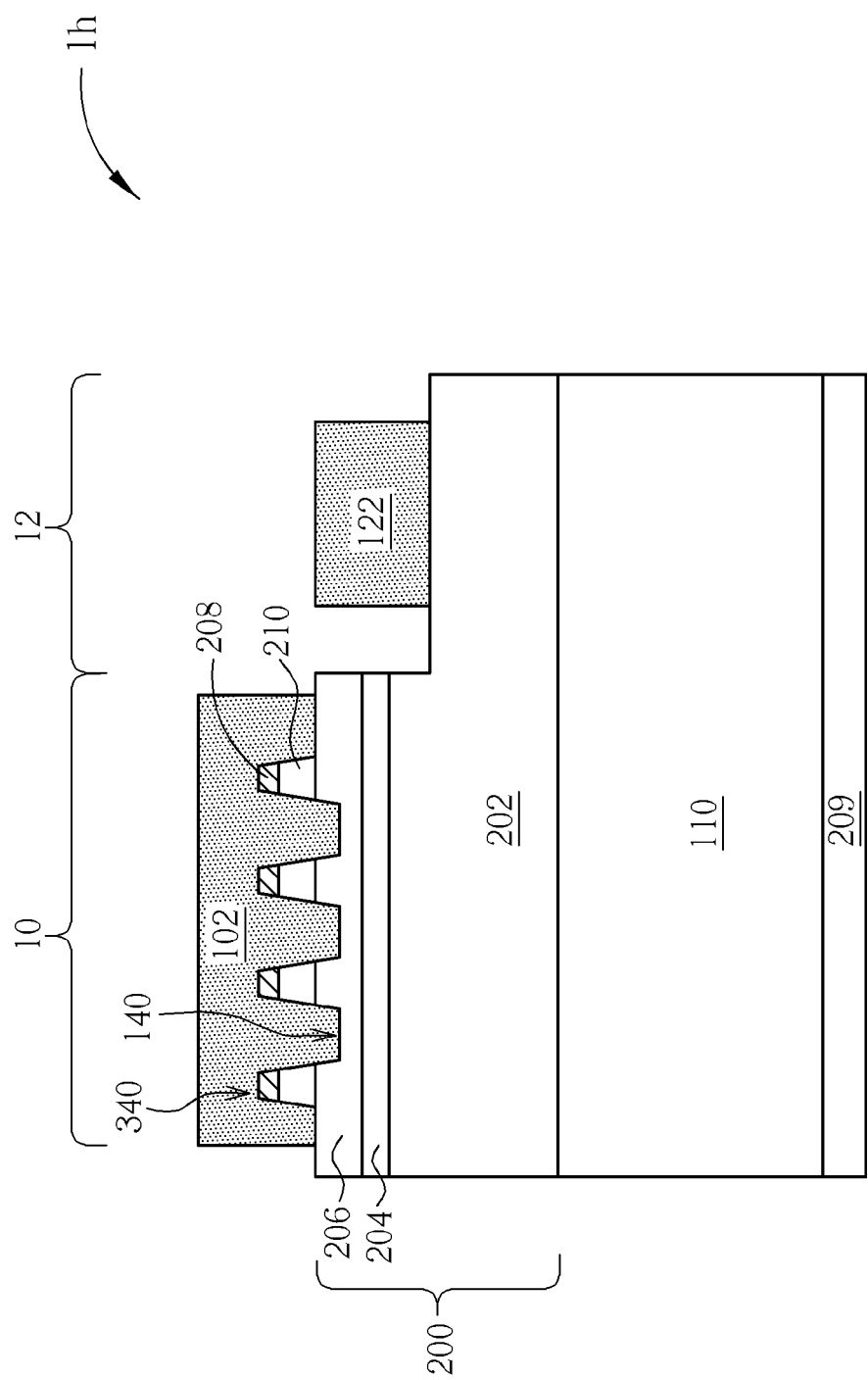
FIG. 9 is a schematic, cross-sectional view showing a light-emitting device according to yet another embodiment of the invention.

FIG. 9 is a schematic, cross-sectional view showing a light-emitting device according to yet another embodiment of the present invention. A light-emitting device 1h shown in FIG. 9 is formed by the following sequence: an epitaxial structure 200, a transparent conductive layer 210, and a distributed Bragg reflector 208 are formed above a substrate 110 successively; a plurality of recessed trenches 140 and three-dimensional patterned structures 340 are formed by etching the distributed Bragg reflector 208, the transparent conductive layer 210, and part of the P-type semiconductor layer 206 in the epitaxial structure 200; then, a P-side electrode pad 102 is formed on the recessed trenches 140 and the three-dimensional patterned structures 340; an N-side electrode pad 122 is formed within a N electrode contact area 12 outside of the mesa area 10; finally, a reflector 209 may be disposed on the bottom of the substrate 110, opposed to the side of the front face, in order to reflect the light generated by the light-emitting active layer 204 and improve the light extraction efficiency of the light-emitting device 1h.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A light-emitting device, comprising:
   a substrate;
   an epitaxial structure on the substrate, wherein the epitaxial structure comprises at least a first conductivity type semiconductor layer, a light-emitting active layer, and a second conductivity type semiconductor layer;
   a first electrode on the first conductivity type semiconductor layer;
   a transparent conductive layer between the first electrode and the first conductivity type semiconductor layer; and
   a distributed Bragg reflector (DBR) layer between the transparent conductive layer and the first electrode, wherein the epitaxial structure comprises a plurality of pillar structures and the pillar structures are formed under the first electrode only.

2. The light-emitting device according to claim 1, wherein the transparent conductive layer is formed on a surface of the plurality of pillar structures.

3. The light-emitting device according to claim 1, wherein there are recessed trenches between the pillar structures.

4. The light-emitting device according to claim 3, wherein a depth of the recessed trenches does not exceed a thickness of the first conductivity type semiconductor layer.

5. A light-emitting device, comprising:
a substrate;
an epitaxial structure on the substrate, wherein the epitaxial structure comprises a first conductivity type semiconductor layer, a light-emitting active layer, and a second conductivity type semiconductor layer;
a first electrode on the first conductivity type semiconductor layer;
a distributed Bragg reflector (DBR) layer between the first electrode and the first conductivity type semiconductor layer; and
a transparent conductive layer between the first electrode and the epitaxial structure;
wherein the epitaxial structure comprises a plurality of pillar structures and the pillar structures are formed under the first electrode only.

6. The light-emitting device according to claim 5, wherein the first electrode comprises a branch electrode and an electrode pad.

7. The light-emitting device according to claim 6, wherein the pillar structure is only under the electrode pad.

8. The light-emitting device according to claim 5, wherein the first electrode comprises a branch electrode and an electrode pad, and the transparent conductive layer overlaps with the branch electrode only.

9. The light-emitting device according to claim 5, wherein the first electrode comprises a branch electrode and an electrode pad, and the transparent conductive layer overlaps with the branch electrode and a peripheral edge of the electrode pad only.

10. The light-emitting device according to claim 5, further comprising a recessed trench under the first electrode.

11. The light-emitting device according to claim 10, wherein a depth of the recessed trench does not exceed a thickness of the first conductivity type semiconductor layer.

12. The light-emitting device according to claim 10, wherein a depth of the recessed trench does not exceed a total thickness of the first conductivity type semiconductor layer and the light-emitting active layer.

13. The light-emitting device according to claim 10, wherein a depth of the recessed trench does not exceed a total thickness of the first conductivity type semiconductor layer, the light-emitting active layer and the second conductivity type semiconductor layer.

14. The light-emitting device according to claim 5, further comprising a reflector disposed on the substrate, wherein the reflector and the first electrode are respectively on opposite sides of the substrate.

* * * * *